United States Patent
Sohn

(10) Patent No.: US 7,053,947 B2
(45) Date of Patent: May 30, 2006

(54) METHODS FOR IMPROVING SENSITIVITY OF CMOS ACTIVE PIXEL SENSORS

(75) Inventor: Il-Young Sohn, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 784 days.

(21) Appl. No.: 10/067,153

(22) Filed: Feb. 4, 2002

(65) Prior Publication Data

US 2002/0085105 A1 Jul. 4, 2002

Related U.S. Application Data

(62) Division of application No. 09/320,873, filed on May 27, 1999, now Pat. No. 6,365,950.

(30) Foreign Application Priority Data

Jun. 2, 1998 (KR) .................................. 98-20364

(51) Int. Cl.
*H04N 9/64* (2006.01)
*H04N 3/14* (2006.01)
*H04N 5/335* (2006.01)
*H01L 27/00* (2006.01)

(52) U.S. Cl. .................... 348/308; 348/243; 250/208.1

(58) Field of Classification Search ................ 348/243, 348/300–309, 294; 257/431, 233–239, 292–294, 257/369, 382; 250/208.1, 214 R
See application file for complete search history.

(56) References Cited

U.S. PATENT DOCUMENTS

| 4,916,307 | A | * | 4/1990 | Nishibe et al. | .......... 250/214 C |
| 5,912,463 | A | * | 6/1999 | Mizuno et al. | .......... 250/338.1 |
| 6,498,331 | B1 | * | 12/2002 | Kozlowski et al. | ...... 250/208.1 |
| 6,690,423 | B1 | * | 2/2004 | Nakamura et al. | .......... 348/311 |
| 6,747,695 | B1 | * | 6/2004 | Afghahi | ...................... 348/241 |

* cited by examiner

*Primary Examiner*—Ngoc-Yen Vu
*Assistant Examiner*—Kelly Jerabek
(74) *Attorney, Agent, or Firm*—F. Chau & Associates LLC

(57) ABSTRACT

The present invention relates to a CMOS active pixel sensor which includes a compensation circuit capable of compensating a lowered pixel voltage output due to leakage current of a photodiode. The CMOS active pixel sensor having a light sensing unit for generating an output voltage when light is incident thereupon, the sensing unit having an amount of leakage current before the incidence of light. A reset unit resets the output voltage of the light sensing unit to an initial reset voltage in response to a reset signal. A sense transistor has a source, a drain coupled to a power source voltage, and a gate coupled to the output of the light sensing unit. A select transistor has a drain connected to a source of the sense transistor, and provides the voltage of the sense transistor to a bit line, in response to a select signal. A compensation unit supplies a voltage corresponding to the output voltage of the light sensing unit lowered by the leakage current.

6 Claims, 5 Drawing Sheets

METHODS FOR IMPROVING SENSITIVITY OF CMOS ACTIVE PIXEL SENSORS

CROSS-REFERENCE TO RELATED APPLICATIONS

This application is a Divisional of U.S. application Ser. No. 09/320,873 filed on May 27, 1999 now U.S. Pat. No. 6,365,950, which claims priority to Korean Application No. 98-20364 filed on Jun. 2, 1998.

FIELD OF THE INVENTION

The present invention relates to an image sensor, and more particularly to a CMOS active pixel sensor capable of compensating loss of sensor sensitivity due to leakage current in a light sensing device.

BACKGROUND OF THE INVENTION

Charge-coupled devices (CCDs) have been the mainstay of conventional imaging circuits for converting images in the form of light energy into electrical signals. Advantages of CCD use include high sensitivity and full-factor. However, CCDs suffer from a number of weaknesses including limited readout rates and dynamic ranges, and difficulty in integrating CCDs with CMOS-based microprocessors.

FIG. 1 is a circuit diagram illustrating a conventional CMOS active pixel sensor. As shown in FIG. 1, the active pixel sensor (APS) 10 (or active pixel sensor cell) includes a photodiode 12 acting as light sensing means. This photodiode 12 has a cathode and an anode. The anode of the photodiode 12 is grounded, and the cathode thereof is collectively coupled to a source of N-channel reset transistor 14 and a gate of N-channel sense transistor 16. A drain of the N-channel reset transistor 14 is coupled to a power supply voltage Vdd, a source thereof is coupled to the cathode of the photodiode 12, and a gate thereof is coupled to a reset line 20.

The N-channel sense transistor 16 has a drain coupled to the power supply voltage Vdd, a gate coupled to the cathode of the photodiode 12 and the source of the reset transistor 14, and a source thereof coupled to a drain of N-channel row select transistor 18. A gate of the row select transistor 18 is coupled to a select line 22, and a source thereof is coupled to a bit line 24.

An operation of the active pixel sensor cell 10 is performed in three steps: a reset step, wherein the cell 10 is reset from a previous integration cycle; an image integration step, where the light energy is collected and converted into an electrical signal; and a signal readout step, wherein the electrical signal is read out.

During the reset step, the gate of the reset transistor 14 is briefly pulsed with a reset voltage (for example, about 5 volts), which resets the photodiode 12 to an initial integration voltage of $(V_R-V_T)$, wherein the voltage $V_R$ is the reset voltage and the voltage $V_T$ is a threshold voltage of the reset transistor 14.

During the image integration step, light energy, in the form of photons, strikes the photodiode 12, thereby creating a number of electron-hole pairs. Thereafter, the photogenerated holes are attracted to the ground terminal of the photodiode 12, while the photogenerated electrons are attracted to the positive terminal of the photodiode 12. For the additional electrons, the voltage across the photodiode 12 is reduced. The photodiode 12 is designed to limit recombination between the newly formed electron-hole pairs.

At the end of the image integration period, the voltage across the photodiode 12 is equal to $(V_R-V_T-V_S)$, wherein the voltage $V_S$ is a voltage changed by the photons absorbed in the photodiode 12. Thus, voltage $V_S$ corresponds to the absorbed photons, $V_S$ can be determined by subtracting the voltage at the end of the image integration period from the voltage at the beginning of the image integration period. That is, the voltage $V_S$ is $\{(V_R-V_T)-(V_R-V_T-V_S)\}$.

Following the image integration period, the active pixel sensor cell 10 is read out by turning on the row select transistor 18 (which has been kept off until this point). When the voltage across the photodiode 12 decreases, the gate voltage of the sense transistor 16 is also reduced, causing a reduction in the amount of current flowing to the bit line 24 through the transistors 16 and 18. Thereafter, a voltage $V_{PX}$ (or referred to as "a pixel voltage") on the bit line 24 is detected by a conventional current detector.

FIG. 2 is a graphical illustration of the pixel voltage of the active pixel sensor 10 before and after a light incidence. During a non-exposure time for the light incidence, the pixel voltage $V_{PX}$, that is, the voltage on the bit line 24 of FIG. 1, is lowered by a voltage $V_D$ corresponding to the dark current of the photodiode 12. During exposure from the incident light, the pixel voltage $V_{PX}$ is rapidly lowered. The non-exposure (reset) time t1 before the light incidence and the exposure time t2 during the light incidence can be different for different sensors dependant upon factors such as the size of the active pixel sensor cells.

After the photodiode 12 is reset by the reset integration voltage $(V_R-V_T)$, as set forth above, the voltage of the photodiode 12 is lowered by a voltage $V_D$ corresponding to dark current (or leakage current) regardless of light energy before the incidence of light energy. As a result, the pixel voltage $V_{PX}=(V_R-V_T-V_S-V_D)$.

One problem of the above described CMOS active pixel sensor cell is that the dark current (or the leakage current) in the active pixel sensor cell 10 increases the noise level present at the gate of the select transistor. As a result, this decreases the sensitivity of the sensor. Since the amount of dark current occurring in active pixel sensor cells is different for different cells, it is difficult to compensate the dark current by a fixed offset.

SUMMARY OF THE INVENTION

It is therefore an object of the present invention to solve the above mentioned problems and to provide a CMOS active pixel sensor capable of compensating for performance loss due to leakage current in sensor.

According to an aspect of the present invention, a CMOS active pixel sensor is provided which comprises light sensing means for generating an output voltage at an output when light is incident thereupon, said light sensing means having an amount of leakage current before said light incidence, reset means for resetting the output voltage of the light sensing means to an initial reset voltage in response to a reset signal, a sense transistor having a source, a drain coupled to a power source, and a gate coupled to the output of the light sensing means, a select transistor having a drain connected to the source of the sense transistor, for providing a voltage at a source of the sense transistor to a bit line, in response to a select signal, and compensation means for supplying a voltage to the select transistor substantially corresponding to the output voltage of the light sensing means lowered by the leakage current.

Preferably, the compensation means comprises shielded light sensing means shielded from incident light, a first transistor for resetting an output voltage of the shielded light sensing means to the initial reset voltage in response to the reset signal, and a second transistor having a source, a drain coupled to the power source and a gate coupled to the output of the shielded light sensing means, for increasing current flow to the drain of the select transistor in an amount proportional to the leakage current of the shielded light sensing means.

Also provided is a method of increasing voltage readout sensitivity of a CMOS active pixel sensor, said sensor including a first photodiode having leakage current flow, a first reset transistor for resetting photodiode voltage and a first sense transistor connected to said photodiode, the method comprising the steps of: commonly connecting a second sense transistor at drain and source of said first sense transistor, said second sense transistor is of a type complementary to said first sense transistor; commonly connecting a second reset transistor to said first reset transistor for activating both first and second reset transistors by a reset signal; shielding a second photodiode from light incident on said first photodiode and connecting said second photodiode to said second reset transistor; and second source transistor, and reading out voltage upon illumination of incident light on said first photodiode by activating a select transistor connected to said first and second sense transistors.

Preferably, the first and second sense transistors are of NMOS and PMOS type, respectively.

These and other aspects, features and advantages of the present invention will become more readily apparent from the following detailed description of preferred embodiments, which is to be read in connection with the accompanying drawings.

BRIEF DESCRIPTION OF THE DRAWINGS

An embodiment of the invention will be described by way of example and with reference to the accompanying drawings, in which.

DESCRIPTION OF PREFERRED EMBODIMENTS

The invention will be now be described in detail with reference to the accompanying drawings.

Figure 3:
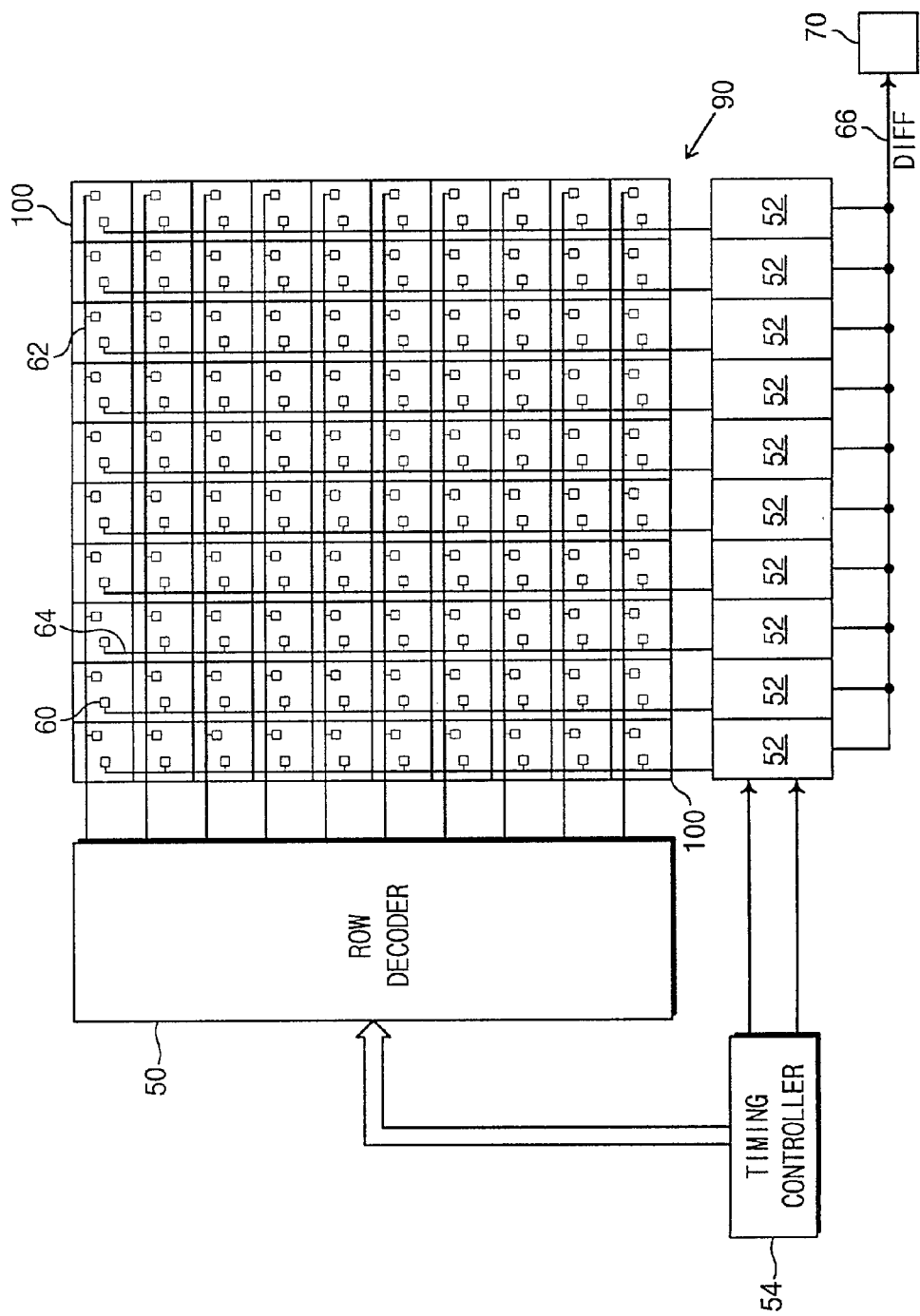
FIG. 3 is a schematic diagram of a CMOS active pixel sensor imaging system in accordance with the present invention.

FIG. 3 is a schematic diagram of an active pixel sensor imaging system according to the present invention. The active pixel sensor imaging system has a row decoder 50, a plurality of differential output circuits 52, a timing controller 54, and an array 90 of active pixel sensors 100. The active pixel sensor array 90 comprises closely spaced active pixel sensors 100 in ten rows and ten columns. The active pixel sensor array 90 is illustrated as a ten-by-ten array for illustrative purposes only and is not meant to be a limitation on the present invention. The active pixel sensor array 90 according to the present invention may be comprised of active pixel sensors 100 in any number of rows and columns, and for many applications the array includes a large number of pixels.

Each active pixel sensor 100 is capable of converting a detected quantity of light to corresponding electrical signal at an output port 60. A plurality of control lines 62 extend along corresponding sensor rows from the row decoder 50, and are connected to corresponding pixel sensors 100 in the respective sensor row. Each of the control lines 62 includes a select line and a reset line.

Each active pixel sensor output port 60 in the corresponding sensor column is coupled by a column output line 64 such as a bit line (or a signal line) to a corresponding differential output circuit 52. Each of the differential output circuits 52 is further coupled to a common imaging system output line 66. Differential output signal DIFF is generated by the differential output circuits 52 on the output line 66. The differential output signal DIFF may be provided by the output line 66 to other processing circuits 70 to perform, for example, motion detection or video data compression on a viewed image.

In operation, the timing controller 54 provides timing signals to the row decoder 50 which sequentially activates each row 53 of active pixel sensors 100 via the control lines 62 to detect the light intensity and to generate the corresponding output voltage signals during each frame interval.

Figure 1:
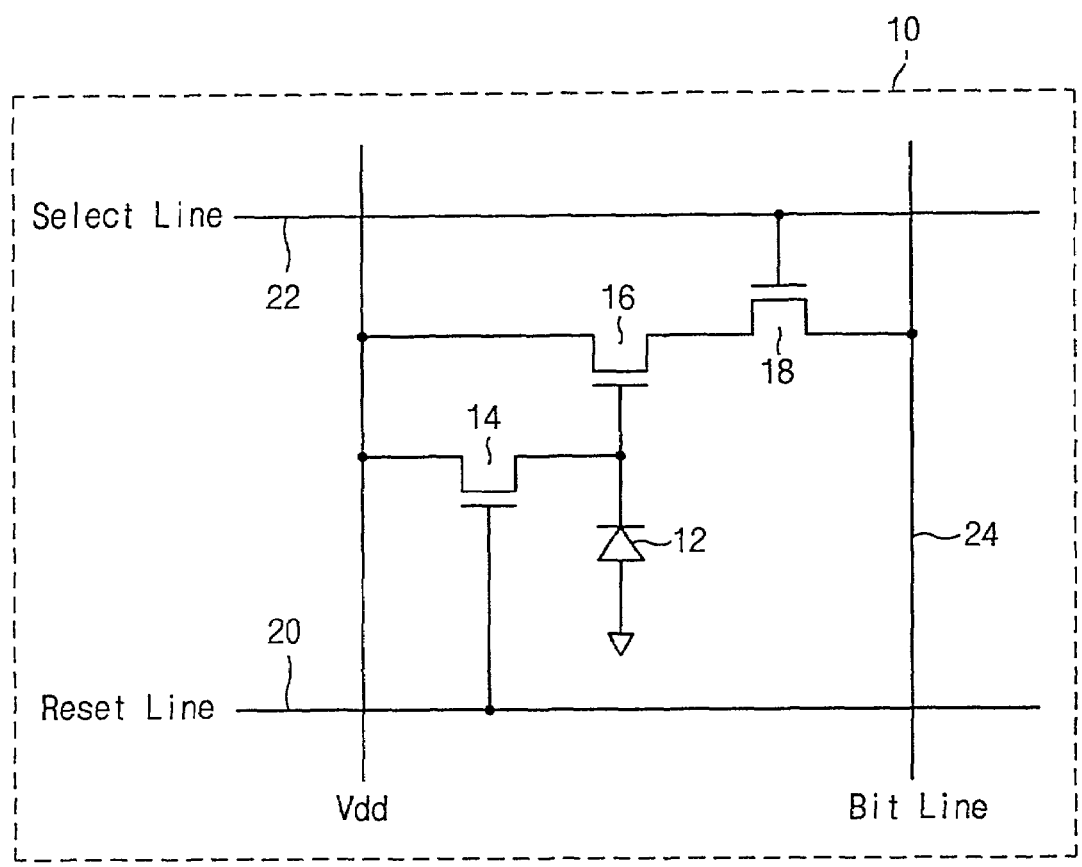
FIG. 1 is a circuit diagram illustrating a conventional CMOS active pixel sensor cell.
Figure 2:
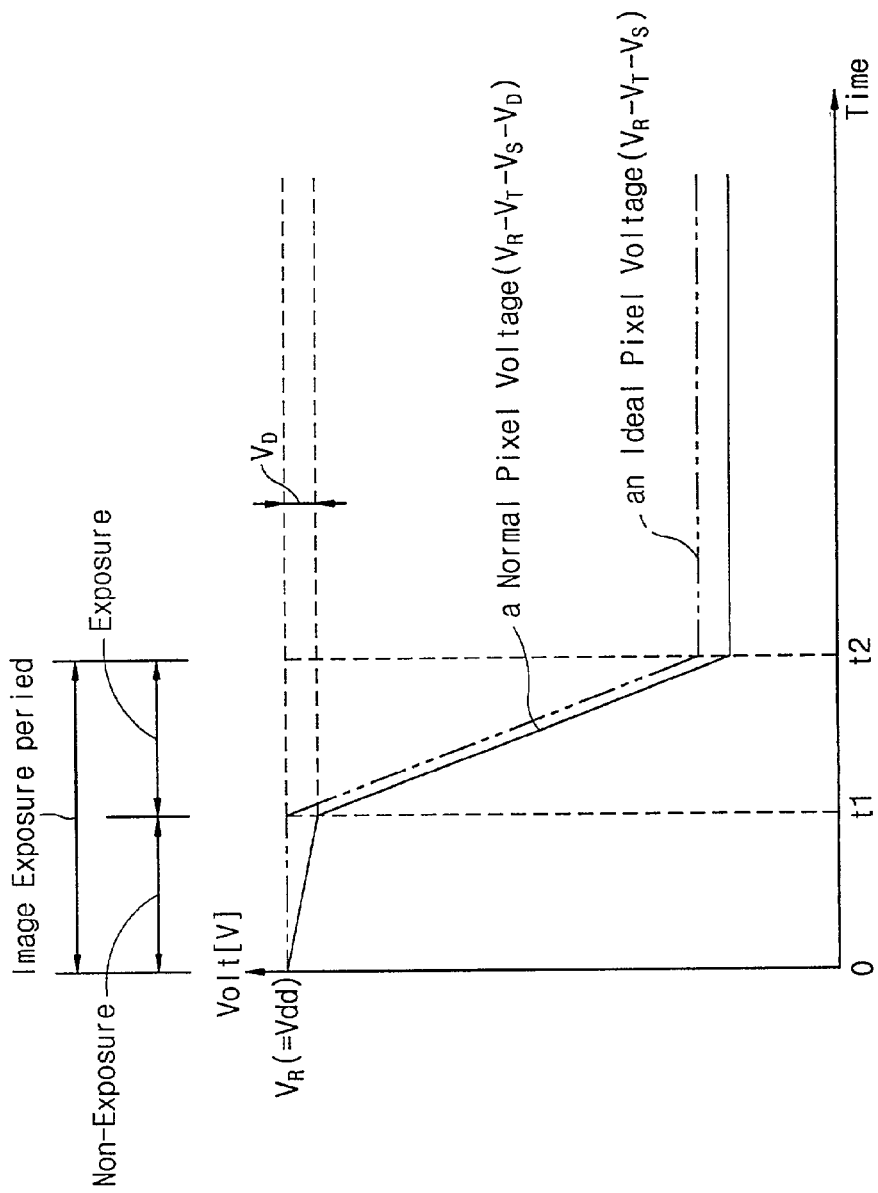
FIG. 2 is a graph showing a change of a pixel voltage from an active pixel sensor before and after a light incidence.
Figure 4:
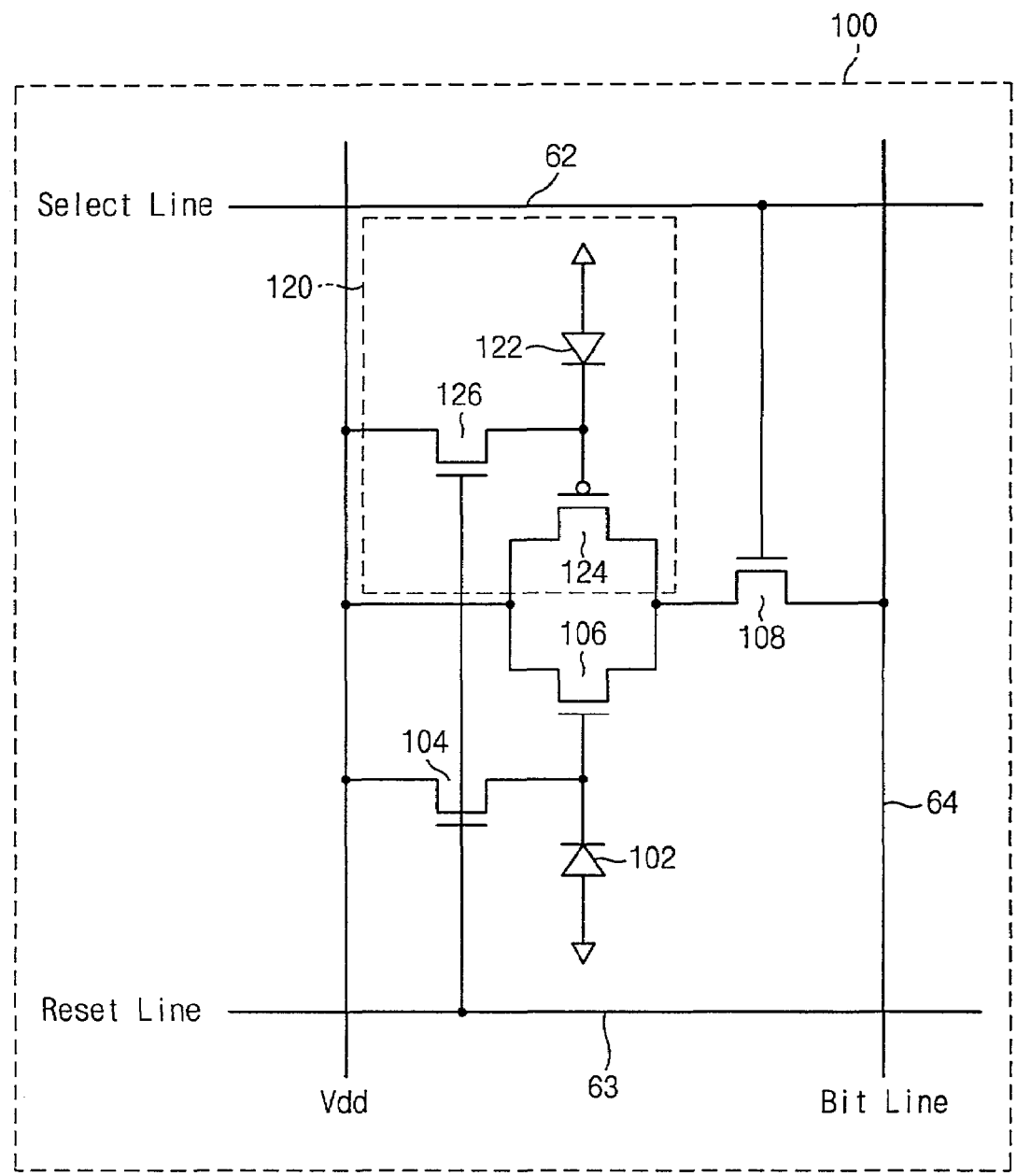
FIG. 4 is a circuit diagram of a CMOS active pixel sensor in an active pixel sensor array illustrated in FIG. 3.

FIG. 4 is a preferred embodiment of a CMOS active pixel sensor 100 of the CMOS active pixel sensor array 90 illustrated in FIG. 3. The CMOS active pixel sensor 100 comprises a photodiode 102 acting as a light sensing device, a reset transistor 104, a sense transistor 106, a row select transistor 108, and a compensation circuit 120. Operations of elements 102 to 108 are essentially as described above for the equivalent elements of FIG. 1.

A compensation circuit 120 according to the present invention serves to compensate the pixel voltage of the photodiode 102 lowered by the dark current (or leakage current). The compensation circuit 120 includes a photodiode 122 which is preferably shielded from light energy, a PMOS transistor 124 for sensing the voltage of the shielded photodiode 122, and an NMOS transistor 126 for resetting the voltage of the shielded photodiode to an initial reset voltage, for example, a voltage of $(Vdd-V_T)$. A dotted line around the photodiode 122 indicates the shield around photodiode 122. In other words, the shielded photodiode 122 is not exposed to the light incidence whereas the photodiode 102 is exposed to the light incidence.

An anode of the shielded photodiode 122 is grounded, and a cathode thereof is commonly coupled to a source of the NMOS transistor 126 and a gate of the PMOS transistor 124. A gate of the NMOS transistor 126 is connected to a reset line 63. Its drain is coupled to the power supply voltage Vdd. As illustrated in FIG. 4, the gates of the NMOS transistors 104 and 126 are collectively coupled to the reset line 63. As a result, the NMOS transistors 104 and 126 are simultaneously turned on when the reset line 63 is activated.

Successively, the PMOS transistor 124 whose gate is coupled in common to the cathode of the shielded photodiode 122 and a source of the NMOS transistor 126 has a drain coupled to the power supply voltage Vdd and a source coupled to a drain of a row select transistor 108. The row select transistor 108 has a gate coupled to a select line 62 and a source coupled to the bit line 64.

The CMOS active pixel sensor 100 according to a preferred embodiment of the present invention is reset at a reset step. When the signal on the reset line 63 is simultaneously input to the gates of the transistors 104 and 126, the photodiode 102 and the shielded photodiode 122 are simultaneously reset by the reset integration voltage ($V_R$–$V_R$), wherein $V_R$ represents the reset voltage and $V_T$ represents a threshold voltage of the respective NMOS transistors 104 and 126.

As set forth above, the voltages of the photodiode 102 and the photodiode 122 are lowered by the dark current or leakage in the photodiodes before the light incidence. Consequently, current flowing to the drain of the transistor 108 from the power supply voltage Vdd through the NMOS transistor 106 is decreased in proportion to the decreased voltage of the photodiode 102 due to its leakage, and at the same time, as the voltage of the shielded photodiode 122 is lowered by its dark current, current flowing to the drain of the transistor 108 from the power supply voltage Vdd through the PMOS transistor 124 is proportionally increased. As a result, the voltage of the photodiode 102 reduced by the dark current is compensated by the compensation circuit 120.

Figure 5A:
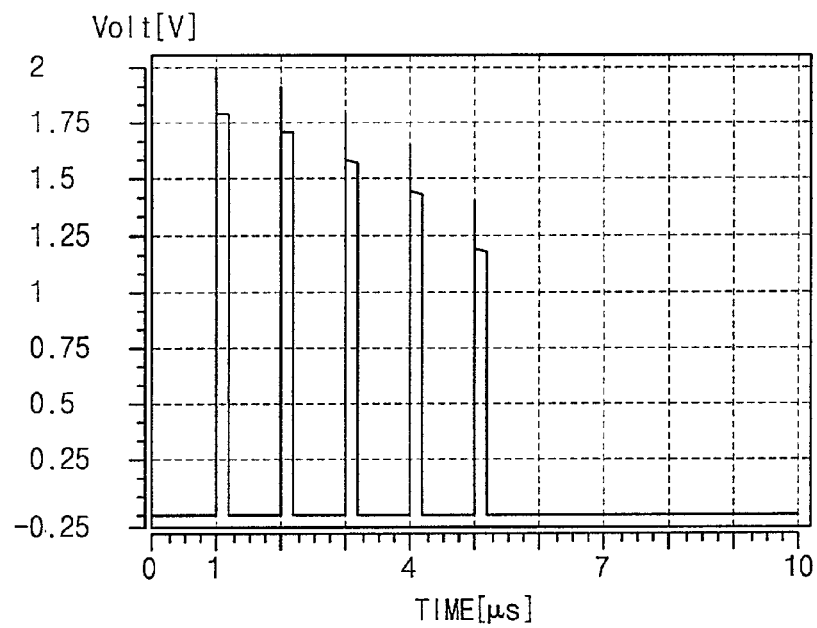
FIG. 5A is a graph illustrating an output voltage of a conventional CMOS active pixel sensor under several illumination circumstances.
Figure 5B:
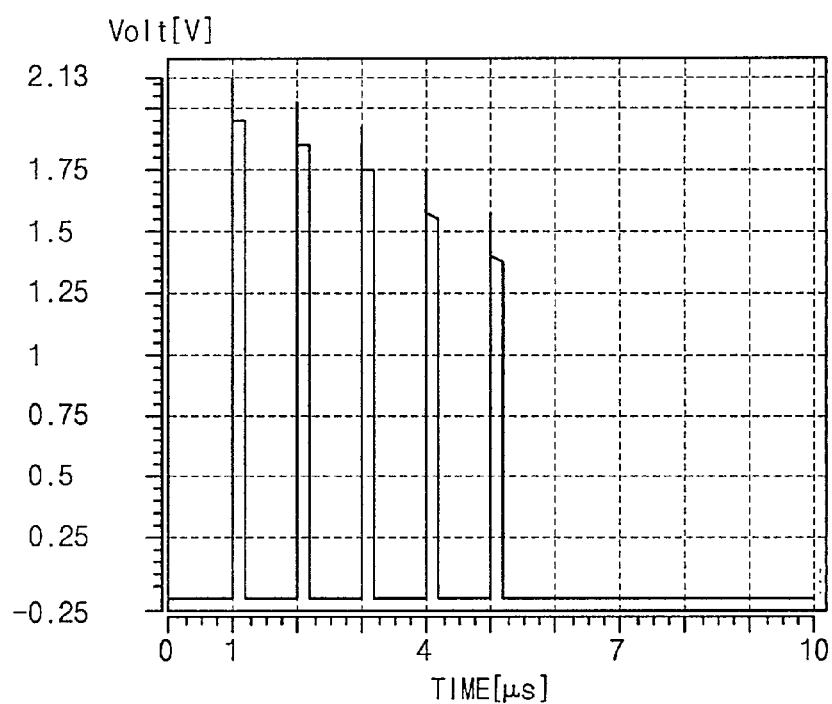
FIG. 5B is a graph illustrating the output voltage of a CMOS active pixel sensor under several illumination circumstances in accordance with the present invention.

FIG. 5A is a graph illustrating a pixel voltage of the conventional CMOS active pixel sensor (FIG. 1) under several indicated illumination circumstances, and FIG. 5B is a-graph illustrating the pixel voltage of the CMOS active pixel sensor under the same illumination circumstances according to a preferred embodiment of the present invention.

It can be seen from FIG. 5A and FIG. 5B that the pixel voltage from the transistor 18 according to the conventional sensor 10 (FIG. 1) is lower than that according to the present invention. The gate voltage of the sense transistor 106 is lowered by the dark current of the photodiode 102 before a light incidence, so that the pixel voltage on the bit line 64 is lowered. Advantageously, the pixel voltage on the bit line 64 is compensated by the PMOS transistor 124, whose gate voltage is lowered by the dark current of the shielded photodiode 122. Therefore, sensing efficiency of the sensor and image quality of the sensor are improved.

While the invention has been particularly shown and described with reference to a preferred embodiment, it will be understood by those skilled in the art that modifications in detail may be made without departing from the spirit and scope of the invention.

What is claimed is:

1. A method of increasing voltage readout sensitivity of a CMOS active pixel sensor, said sensor including a first photodiode having leakage current flow, a first reset transistor for resetting photodiode voltage and a first sense transistor connected to said photodiode, the method comprising the steps of:

commonly connecting a second sense transistor at a drain and a source of said first sense transistor, said second sense transistor is of a type complementary to said first sense transistor;

commonly connecting a second reset transistor to said first reset transistor for activating both first and second reset transistors by a reset signal;

shielding a second photodiode from light incident on said first photodiode and connecting said second photodiode to said second reset transistor and second sense transistor; and reading out voltage upon illumination of incident light on said first photodiode by activating a select transistor connected to said first and second sense transistors.

2. The method according to claim 1, wherein said first sense transistor is a NMOS transistor an second sense transistor is a PMOS transistor.

3. A method for compensating loss of sensitivity of a CMOS active pixel sensor, comprising the steps of:

compensating for loss of pixel voltage of the CMOS active pixel sensor caused by leakage current of a first photodiode connected to a gate of a first sense transistor using leakage current of a second photodiode connected to a gate of a second sense transistor complementary to the first sense transistor, wherein compensating comprises increasing the amount of current flowing to a bit line through the second sense transistor in an amount substantially proportional to the amount of decreased current flow to the bit line through the first sense transistor due to a decreased voltage of the first photodiode.

4. The method of claim 3, wherein the second photodiode is shielded from light incidence.

5. A method for operating a CMOS active pixel sensor, comprising the steps of:

resetting a voltage level of a first photodiode and a second photodiode;

applying light energy to the first photodiode;

reading a pixel voltage of the CMOS active pixel sensor by sensing the voltage of the first photodiode after light energy is applied; and compensating for loss of pixel voltage of the CMOS active pixel sensor caused by leakage current of a first photodiode connected to a gate of a first sense transistor using leakage current of a second photodiode connected to a gate of a second sense transistor complementary to the first sense transistor, wherein compensating comprises increasing the amount of current flowing to a bit line through the second sense transistor in an amount substantially proportional to the amount of decreased current flow to the bit line through the first sense transistor due to a decreased voltage of the first photodiode.

6. The method of claim 5, wherein the second photodiode is shielded from light incidence.

* * * * *